United States Patent [19]

Morishima

[11] Patent Number: 5,521,952
[45] Date of Patent: May 28, 1996

[54] PULSE COUNTER CIRCUIT AND PULSE SIGNAL CHANGEOVER CIRCUIT THEREFOR

[75] Inventor: Morito Morishima, Hamamatsu, Japan

[73] Assignee: Yamaha Corporation, Hamamatsu, Japan

[21] Appl. No.: 350,829

[22] Filed: Dec. 7, 1994

[30] Foreign Application Priority Data

Dec. 8, 1993 [JP] Japan .................. 5-340671

[51] Int. Cl.$^6$ .................. H03K 21/02; H03K 17/28
[52] U.S. Cl. .................. 377/55; 327/160; 327/171; 327/261; 327/396; 377/39
[58] Field of Search .................. 377/55, 39; 327/107, 327/160, 171, 176, 398, 261, 392, 396

[56] References Cited

U.S. PATENT DOCUMENTS

| | | | |
|---|---|---|---|
| 4,979,194 | 12/1990 | Kawano | 377/55 |
| 5,045,800 | 9/1991 | Kung | 327/176 |
| 5,047,659 | 9/1991 | Ullrich | 327/171 |
| 5,084,907 | 1/1992 | Maemura | 377/55 |
| 5,371,770 | 12/1994 | Sakuma | 377/55 |

*Primary Examiner*—John S. Heyman
*Attorney, Agent, or Firm*—Loeb & Loeb

[57] ABSTRACT

A pulse counter circuit has an invertor which inverts a pulse signal input thereto to form an inverted signal. One of the pulse signal and the inverted signal is selected in response to a selecting signal, and the selected signal is delivered as an output signal. Changeover of a signal to be selected between the pulse signal and the inverted signal is effected at timing of a change in level of the pulse signal. A counter counts pulses of the output signal. A pulse signal changeover circuit selects one of a pulse signal and an inverted signal obtained by inverting the pulse signal, in response to a selecting signal, and the selected signal is delivered as an output signal. The pulse signal is masked by being held at a predetermined level within a predetermined time period, and the inverted signal is masked by being held at the predetermined level within the predetermined time period. Changeover of a signal to be selected between the pulse signal and the inverted signal is effected within the predetermined time period.

17 Claims, 3 Drawing Sheets

FIG.1
(PRIOR ART)
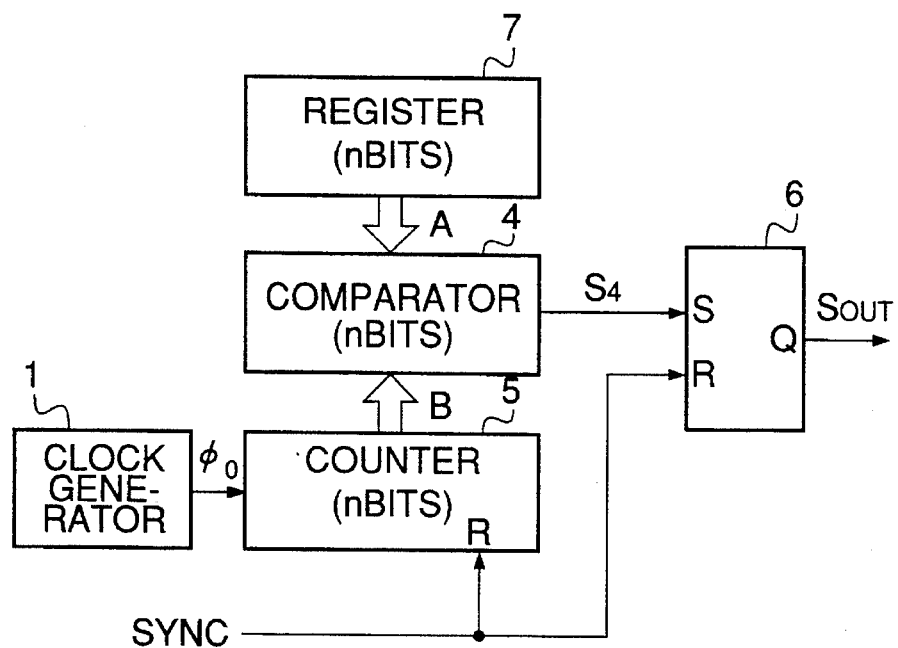
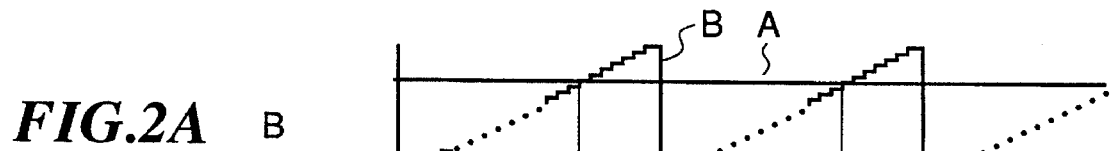
FIG.2A   B
FIG.2B   SYNC
FIG.2C   $S_4$
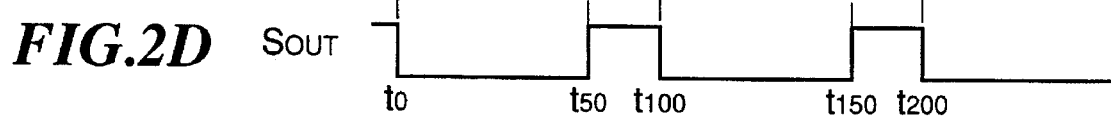
FIG.2D   $S_{OUT}$
$t_0$   $t_{50}$   $t_{100}$   $t_{150}$   $t_{200}$

CLOCK CHANGEOVER CIRCUIT 2

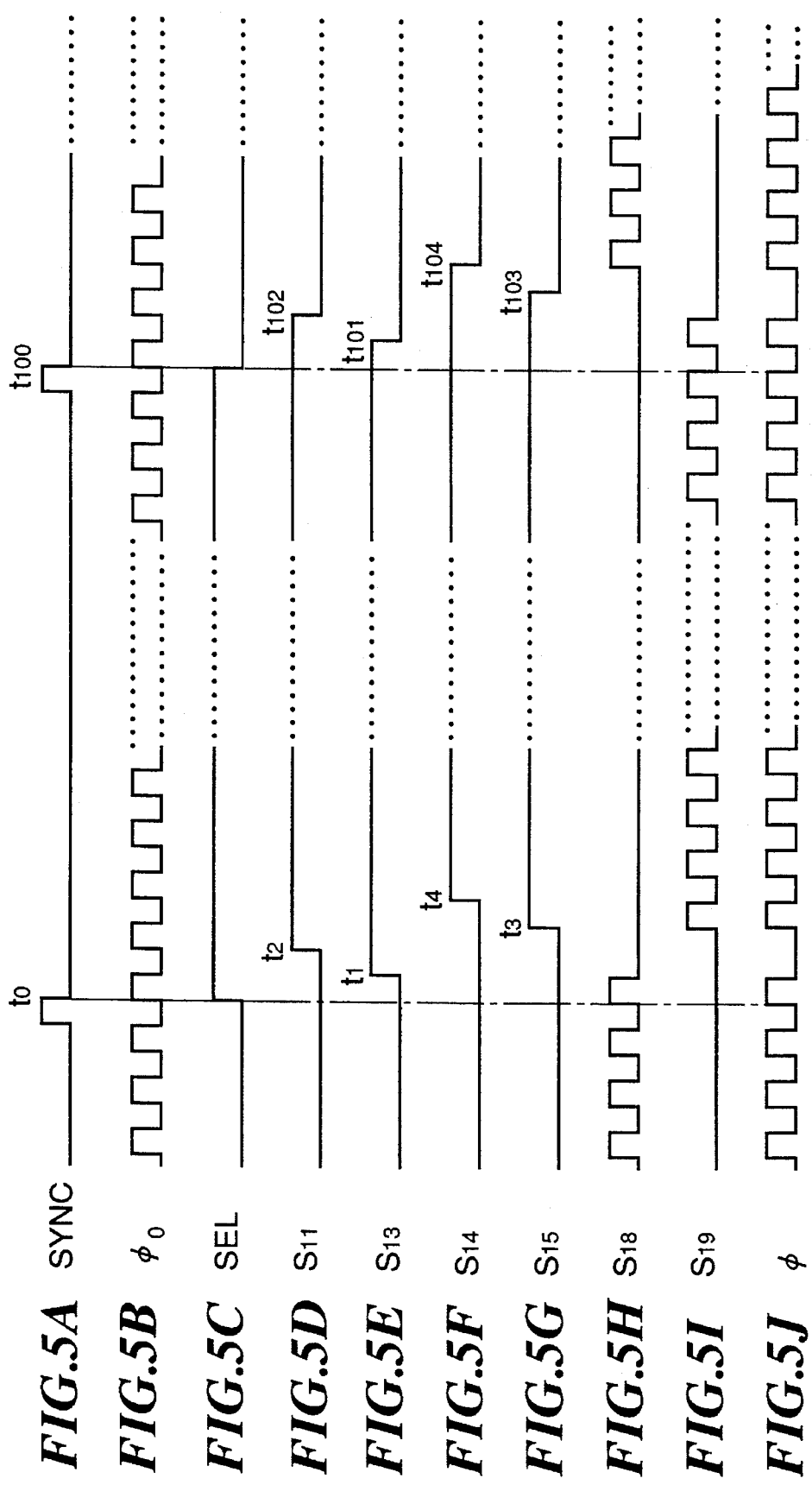

PULSE COUNTER CIRCUIT AND PULSE SIGNAL CHANGEOVER CIRCUIT THEREFOR

BACKGROUND OF THE INVENTION

1. Field of the Invention

This invention relates to a pulse counter circuit adapted to perform precision counting operations, and a pulse signal changeover circuit suitable for use in the pulse counter circuit.

2. Prior Art

Conventionally, there are known circuits which perform various operations based on counted pulses. Such circuits include a PWM (Pulse Width Modulation) circuit, of which a typical construction is shown in FIG. 1. In the figure, reference numeral 1 designates a clock generator for generating a master clock signal $\phi_0$ having a predetermined repetition period. Reference numeral 5 shows a counter which is capable of counting binary data of "n" bits. The count B of the counter 5 is incremented in synchronism with clock pulses of the master clock signal $\phi_0$. The counter 5 is provided with a reset terminal R to which is applied a synchronizing pulse signal SYNC. The count B of the counter 5 is cleared to "0" upon a fall of the pulse signal SYNC. Reference numeral 7 designates a register for storing binary data of "n" bits, and a numerical value corresponding to the binary data of "n" bits is delivered as a reference value A.

Reference numeral 4 designates a comparator for comparing the count value B with the reference value A. When the former is equal to the latter, the comparator 4 delivers a signal at a level "1", whereas when the former is not equal to the latter, it delivers a signal at a level "0". Reference numeral 6 designates an R-S flip-flop which has its internal logical state set to "1" when an input signal applied to an input terminal S thereof falls from "1" to "0", and thereby delivers an output signal $S_{OUT}$ at "1". On the other hand, when an input signal applied to a reset terminal R of the R-S flip-flop 6 falls from "1" to "0", the internal logical state of the R-S flip-flop 6 is reset to "0" to deliver the output signal $S_{OUT}$ at "0". The R-S flip-flop circuit 6 has its set input terminal S supplied with an output signal (signal $S_4$) from the comparator 4. The reset input terminals R of the counter 5 and the R-S flip-flop 6 are each supplied with the aforementioned synchronizing pulse signal SYNC the logical state of which is normally "0", and changed to "1" for a very short time period at intervals of a predetermined time period.

Next, the operation of the above PWM circuit will be described with reference to FIG. 2a to FIG. 2d. Let it be assumed that the register 7 has the reference value A stored therein in advance. First, when the synchronizing pulse signal SYNC falls at a time point $t_0$ as shown in FIG. 2b, the counter 5 and the R-S flip-flop 6 are both reset to "0" as shown in FIG. 2a and FIG. 2d, respectively. Thereafter, as shown in FIG. 2a, the counter 5 counts pulses of the master clock signal $\phi_0$ to increment the count B as time elapses. When the count B becomes equal to the reference value A one repetition period of the master clock signal $\phi_0$ earlier than a time point $t_{50}$, the logical state of the signal $S_4$ is changed to "1" as shown in FIG. 2c. However, with a rise of the following clock pulse at the time point $t_{50}$, the count B becomes larger than the reference value A as shown in FIG. 2a, so that the logical state of the signal $S_4$ is changed again to "0" (FIG. 2c). In synchronism with this change of the logical state of the signal $S_4$ from "1" to "0", the R-S flip flop 6 has its internal logical state set to "1" whereby the output signal $S_{OUT}$ is changed to "1" (FIG. 2d).

Next, when the synchronizing pulse signal SYNC falls again, as shown in FIG. 2b, at a time point $t_{100}$ subsequent to a rise thereof, the counter 5 and the R-S flip-flop 6 are both reset to "0" to clear the count B of the counter 5 to 0 (FIG. 2a) and set the logical state of the output signal $S_{OUT}$ from the flip-flop 6 to "0". Thereafter, the same operations are repeatedly carried out. According to the above construction of the PWM circuit, it is possible to set the timing of a rise of the output signal $S_{OUT}$ (time point $t_{50}$, time point $t_{150}$, ...) as desired by the use of the reference value A, with the timing of a fall of same (time point $t_0$, time point $t_{100}$, time point $t_{200}$, ...) being fixed by the synchronizing pulse signal SYNC. That is, the reference value A can be set to a desired value according to a desired duty ratio, whereby the output signal $S_{OUT}$ can be subjected to pulse width modulation.

According to the above construction of the PWM circuit, however, the time resolution of the output signal $S_{OUT}$ is limited by the frequency of the master clock signal $\phi_0$. In other words, to enhance the time resolution of the output signal $S_{OUT}$, there has been no other method than a method of generating a signal having a frequency higher than that of the master clock signal $\phi_0$ by the use of a frequency synthesizer or the like, to be supplied to the counter 5. However, the use of a frequency synthesizer not only makes the PWM circuit complicated in construction and difficult to handle but also requires an increased manufacturing cost.

SUMMARY OF THE INVENTION

It is a first object of the invention to provide a pulse counter circuit which is capable of performing precision counting operations even when a clock of a low frequency is used.

It is a second object of the invention to provide a pulse signal changeover circuit for changing pulse signals, which is suitable for use in the above pulse counter circuit, which is free from occurrence of a glitch upon change of the pulse signals.

To attain the first object, the present invention provides a pulse counter circuit comprising invertor means for inverting a pulse signal input to the pulse counter circuit to form an inverted signal, selecting signal-forming means for forming a selecting signal, selector means responsive to the selecting signal from the selecting means, for selecting one of the pulse signal and the inverted signal to deliver the selected one of the pulse signal and the inverted signal as an output signal, the selector means effecting changeover of a signal to be selected thereby between the pulse signal and the inverted signal, at timing of a change in level of the pulse signal, and counter means for counting pulses of the output signal from the selector means.

Preferably, the selector means selects one of the pulse signal and the inverted signal when the selecting signal is at a first predetermined level, and the other of the pulse signal and the inverted signal when the selecting signal is at a second predetermined value.

Also preferably, the selector means effects the changeover of a signal to be selected thereby between the pulse signal and the inverted signal, in synchronism with a rise or a fall of the pulse signal.

More preferably, selecting signal-forming means is responsive to a setting signal input thereto, for assuming a first mode in which the selecting signal is held at a first predetermined level, and a second mode in which the selecting signal is alternately changed to the first predetermined level and to a second predetermined level, the selector means selecting only a predetermined one of the pulse signal and the inverted signal, in the first mode, and alternately selecting the pulse signal and the inverted signal in response to changes in the selecting signal, in the second mode.

In a preferred embodiment of the invention, the selecting signal-forming means is responsive to a synchronizing signal input thereto, for changing the selecting signal, in the second mode.

In the preferred embodiment, the selector means includes synthesizing means for synthesizing the pulse signal and the inverted signal alternately selected by the selector means to deliver the resulting synthesized signal as the output signal.

In the preferred embodiment, the selector means includes first masking means responsive to a change in level of the selecting signal from a first predetermined level to a second predetermined level, for holding one of the pulse signal and the inverted signal at a predetermined level a predetermined time period earlier than the timing of the change in level of the pulse signal, and responsive to a subsequent change in level of the selecting signal from the second predetermined level to the first predetermined level, for causing the one of the pulse signal and the inverted signal to restore an original waveform thereof the predetermined time period later than the timing of the change in level of the pulse signal, second masking means responsive to a change in level of the selecting signal from the second predetermined level to the first predetermined level, for holding the other of the pulse signal and the inverted signal at the predetermined level the predetermined time period earlier than the timing of the change in level of the pulse signal, and responsive to a subsequent change in level of the selecting signal from the first predetermined level to the second predetermined level, for causing the other of the pulse signal and the inverted signal to restore an original waveform thereof the predetermined time period later than the timing of the change in level of the pulse signal, and synthesizing means for synthesizing the pulse signal and the inverted signal from the first and second masking means to deliver the resulting synthesized signal as the output signal.

To attain the second object, the present invention provides a pulse signal changeover circuit comprising input means for inputting a pulse signal and an inverted signal obtained by inverting the pulse signal, selecting signal-forming means for forming a selecting signal, selector means responsive to the selecting signal from the selecting means, for selecting one of the pulse signal and the inverted signal to deliver the selected one of the pulse signal and the inverted signal as an output signal, first masking means for holding the pulse signal at a predetermined level within a predetermined time period, second masking means for holding the inverted signal at the predetermined level within the predetermined time period, and changeover means for effecting changeover of a signal to be selected by the selecting means between the pulse signal and the inverted signal, within the predetermined time period.

Advantageously, the changeover means is responsive to timing of a change in level of the selecting signal and timing of a change in level of the pulse signal, for effecting the changeover of a signal to be selected thereby between the pulse signal and the inverted signal, the predetermined time period being set based on the timing of the change in level of the selecting signal and the timing of the change in level of the pulse signal.

In a preferred embodiment of the invention, the selector means includes synthesizing means for synthesizing the pulse signal and the inverted signal from the first and second masking means to deliver the resulting synthesized signal as the output signal.

The above and other objects, features, and advantages of the invention will become more apparent from the following detailed description taken in conjunction with the accompanying drawings.

BRIEF DESCRIPTION OF THE DRAWINGS

FIG. 1 is a block diagram showing the arrangement of a conventional PWM circuit;

FIG. 2a to FIG. 2d collectively form a timing chart showing the operation of the conventional PWM circuit of FIG. 1, in which:

FIG. 2a shows the count B of a counter appearing in FIG. 1;

FIG. 2b shows a synchronizing pulse signal SYNC;

FIG. 2c shows an output signal $S_4$ from a comparator appearing in FIG. 1; and

FIG. 2d shows an output signal $S_{OUT}$ from an R-S flip-flop appearing in FIG. 1;

FIG. 5a to FIG. 5j collectively form a timing chart showing the operation of the clock changeover circuit, in which:

FIG. 5a shows a synchronizing pulse signal SYNC;

FIG. 5b shows a master clock signal $\phi_0$;

FIG. 5c shows a selecting signal SEL;

FIG. 5d shows a signal $S_{11}$;

FIG. 5e shows a signal $S_{13}$;

FIG. 5f shows a signal $S_{14}$;

FIG. 5g shows a signal $S_{15}$;

FIG. 5h shows a signal $S_{18}$;

FIG. 5i shows a signal $S_{19}$; and

FIG. 5j shows a clock signal $\phi$.

DETAILED DESCRIPTION

Figure 3:
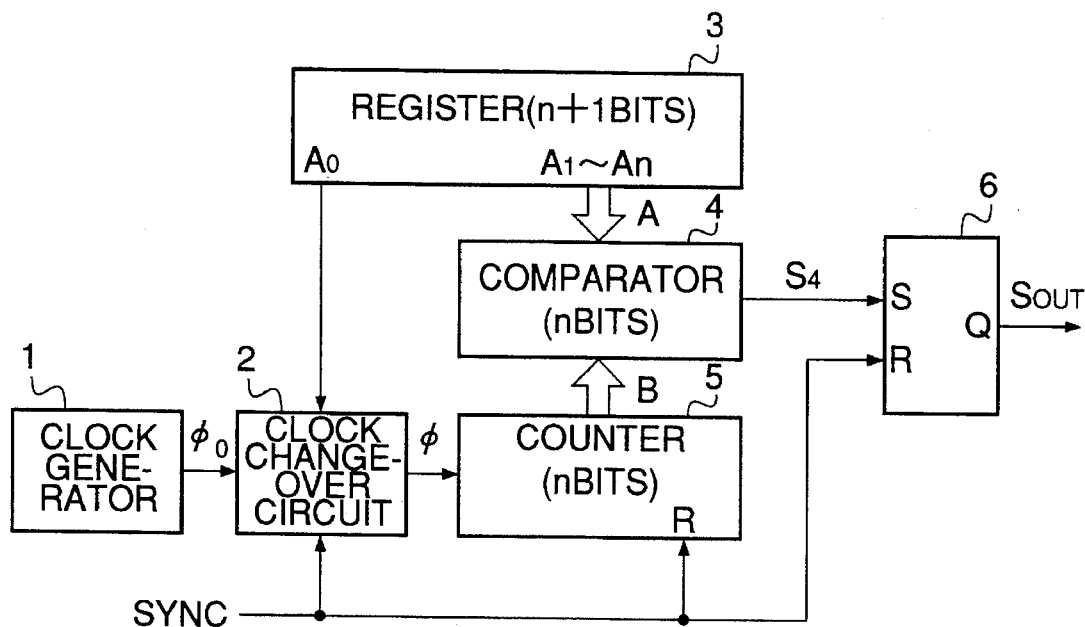
FIG. 3 is a block diagram showing a PWM circuit incorporating a pulse counter circuit and a pulse signal changeover circuit according to an embodiment of the invention.

The invention will be described in detail with reference to FIG. 3 to FIG. 5j. FIG. 3 shows a PWM (Pulse Width Modulation) circuit incorporating a pulse counter circuit and a pulse signal changeover circuit according to an embodiment of the invention. In the figure, component elements and parts corresponding to those in FIG. 1 are designated by identical reference numerals, and detailed description thereof is omitted.

In FIG. 3, reference numeral 1 designates a clock generator, which has an output thereof connected to a clock input of a clock changeover circuit 2. The clock changeover circuit 2 has an output thereof connected to a clock input of a counter 5. The counter 5 has a count output thereof connected to one input of a comparator 4, while a register 3 has an output thereof connected to the other input of the comparator 4. The comparator 4 has an output thereof connected to a set input terminal S of an R-S flip-flop circuit 6.

The register 3 is a register of "n+1" bits which stores a reference value A represented by binary data of "n+1" bits, and delivers the more significant "n" bits of the binary data (reference value A) to the comparator 4. The register 3 is connected to the clock changeover circuit 2 to supply the least significant bit $A_0$ thereto.

The clock generator 1, comparator 4, counter 5, and R-S flip-flop circuit 6 are identical in construction and function to the respective corresponding ones of the conventional PWM circuit in FIG. 1, described hereinbefore.

The clock changeover circuit 2 is responsive to the least significant bit $A_0$ of the reference value A, a master clock signal $\phi_0$ from the clock generator 1, and a synchronizing clock signal SYNC from a clock generator, not shown, for generating a clock signal $\phi$, as will be described in detail hereinafter. The clock signal $\phi$ is supplied to the counter 5.

With the above arrangement, the counter 5 counts pulses of the clock signal $\phi$ to deliver the count B thereof to the comparator 4. The comparator 4 compares the count B with a numerical value corresponding to the more significant "n" bits of the reference value A. When the former is equal to the latter, the comparator 4 delivers a signal $S_4$ at a level "1" to the set input terminal S of the R-S flip-flop circuit 6.

Now, the arrangement of the clock changeover circuit 2 will be described in detail with reference to FIG. 4.

Figure 4:
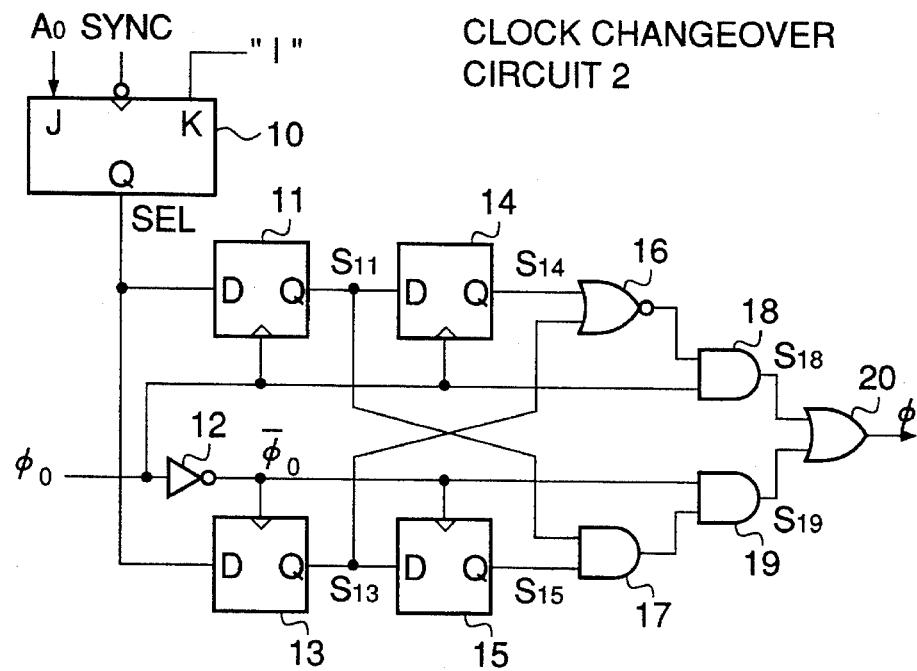
FIG. 4 is a circuit diagram showing details of the arrangement of the clock changeover circuit.

In FIG. 4, reference numeral 10 designates a J-K flip-flop circuit. The J-K flip-flop circuit 10 has an input terminal K thereof to which a signal at a level "1" is constantly applied, and an input terminal J thereof to which the least significant bit $A_0$ of the reference value A is applied. Therefore, when the least significant bit $A_0$ is at "0", the J-K flip-flop circuit 10 constantly delivers an output signal at "0" through an output terminal Q thereof, whereas when the least significant bit $A_0$ is at "1", the output signal from the J-K flip-flop circuit 10 is inverted whenever the synchronizing pulse signal SYNC, which is applied to a clock input signal thereof, falls. The output signal from the J-K flip-flop circuit 10 is applied as a selecting signal SEL to related component parts of the clock changeover circuit 2.

Reference numeral 12 designates an inverter for inverting the master clock signal $\phi_0$ to deliver an inverted clock signal $-\phi_0$. Reference numerals 11, 13, 14, and 15 each designate a D flip-flop circuit. The D flip-flop circuits 11, 13 latch the selecting signal SEL to deliver respective signals $S_{11}$ and $S_{13}$, and the D flip-flop circuits 14, 15 latch respective outputs from the D flip-flop circuits 11, 13 to deliver respective signals $S_{14}$ and $S_{15}$. Changes in the states of these signals $S_{11}$–$S_{14}$ are shown in FIG. 5a to FIG. 5g. As shown in FIG. 5a, the synchronizing pulse signal SYNC falls to "0" at a time point $t_0$. Assuming that the least significant bit $A_0$ of the reference value A is at "1", the selecting signal SEL is inverted as shown in FIG. 5c, i.e. in this example rises to "1".

Next, when the master clock signal $\phi_0$ falls (i.e. the inverted clock signal $-\phi_0$ rises), the selecting signal SEL which is at "1" is latched by the D flip-flop circuit 13. Then, when the master clock signal $\phi_0$ rises at a time point $t_2$, the selecting signal SEL is latched by the D flip-flop circuit 11. Next, when the master clock signal $\phi_0$ falls at a time point $t_3$, the signal $S_{13}$ delivered from the D flip-flop 13 is latched by the D flip-flop circuit 15, and when the master clock signal $\phi_0$ rises at a time point $t_4$, the signal $S_{11}$ delivered from the D flip-flop circuit 11 is latched by the D flip-flop circuit 14. In this embodiment, the master clock signal $\phi_0$ has a duty ratio of 50%, and hence each time interval between $t_1$, $t_2$, $t_3$, and $t_4$ is equal to half the repetition period of the master clock signal $\phi_0$.

Thus, after the selecting signal SEL rises, and before 2.5 repetition periods of the master clock signal $\phi_0$ elapses, the selecting signal SEL is sequentially latched by the D flip-flop circuits 11, and 13 to 15. When the synchronizing pulse signal SYNC falls again at a time point $t_{100}$, the logical state of the selecting signal SEL is inverted to "0". On this occasion as well, over a time period from a time point $t_{101}$ to a time point $t_{104}$, the selecting signal SEL at a level "0" is sequentially latched by the D flip-flop circuits 11 and 13 to 15 in the same order as above.

Referring again to FIG. 4, connected to Q output terminals of the D flip-flop circuits 13, 14 is a NOR circuit 16, which delivers a signal at "1" to one input terminal of an AND circuit 18, when the signals $S_{13}$ and $S_{14}$ are both at "0". The AND circuit 18 has the other input terminal thereof supplied with the master clock signal $\phi_0$, and hence delivers an output signal $S_{18}$ which basically has the same waveform as that of the master clock signal $\phi_0$. However, during a time period from the time point $t_1$ to the time point $t_{104}$, the output signal $S_{18}$ from the ADD circuit 18 is held at "0" due to masking by the signals $S_{13}$ and $S_{14}$ (see FIG. 5h).

Further, connected to Q output terminals of the flip-flop circuits 11, 15 is an AND circuit 17, which delivers a signal at "1" to one input terminal of an AND circuit 19, when the signals $S_{11}$ and $S_{15}$ are at "1". The AND circuit 19 has the other input terminal thereof supplied with the inverted clock signal $-\phi_0$. Therefore, as shown in FIG. 5i, during a time period from the time point $t_3$ to the time point $t_{102}$, an output signal $S_{19}$ from the AND circuit 19 has the same waveform as that of the waveform of the inverted clock signal $-\phi_0$, i.e. restores the waveform of the inverted clock signal $-\phi_0$, and during both time periods before and after the $t_3$–$t_{102}$ time period shown in FIG. 5, the signal $S_{19}$ is held at "0". Connected to outputs of the AND circuits 18, 19 is an OR circuit 20, which delivers the logical sum of the signals $S_{18}$ and $S_{19}$ as the clock signal $\phi$.

The waveform of the clock signal $\phi$ is shown in FIG. 5j. As can be understood from this figure, the clock signal $\phi$ is formed by alternately selecting the master clock signal $\phi_0$ and the inverted clock signal $-\phi_0$ in response to the selecting signal SEL. However, the clock signal $\phi$ is not a mere result of the changeover of these signals $\phi_0$,$-\phi_0$. It should be noted that the timing of changeover of these signals is set to timing (time point $t_2$) of a rise of the master clock signal $\phi_0$, and timing (time point $t_{103}$) of a fall of same. That is, the signal $S_{18}$ as one of the two signals from which the clock signal $\phi$ is synthesized starts to be held at "0" at the time point $t_1$, i.e. a half repetition period earlier than the timing of changeover ($t_2$), while the signal $S_{19}$ as the other of the two signals starts to recover its original waveform from the fixed state to rise to "1" at the time point $t_3$, i.e. a half repetition period thereof later than the timing. Therefore, it is ensured that the level of the clock signal $\phi$ is held at "0" over one repetition period thereof with the timing of changeover being set to the midpoint thereof. The changeover effected at the time point $t_{103}$ is performed in a similar manner, with the relationship between the signals S18 and S19 being exactly opposite to that between them exhibited at the time point $t_2$.

In other words, it can be regarded that the changeover operation described above delays the original clock signal $\phi$ by a half repetition period thereof. More specifically, since one repetition period of the master clock signal $\phi_0$ (or the inverted clock signal $-\phi_0$) consists of a first half repetition period during which the logical state thereof is equal to "1", and a second half repetition period during which the logical state thereof is equal to "0", when the master clock signal $\phi_0$ is switched to the inverted clock signal $-\phi_0$ (at the time period $t_2$) and the latter to the former (at the time point $t_1 03$), the clock signal $\phi$ continues to be at "0" for another half repetition period (in the example shown in FIG. 5j, half repetition period corresponding to the time period $t_2$ to $t_3$ or $t_1 03$ to $t_{104}$), without being changed to "1".

Although the signals $\phi_0$ and $-\phi_0$ can be merely changed at time points $t_2$, $t_1 03$, . . . , it should be noted that due to variations in operating time between various logical circuits, a glitch can occur to cause malfunctioning of the counter 5. In contrast, in the present embodiment, the signals $S_{18}$ and $S_{19}$ are both set to "0" at the time points $t_1$ and $t_{102}$, and changeover between the master clock signal $\phi_0$ and the inverted clock signal $-\phi_0$ is effected through synthesization of these signals $S_{18}$ and $S_{19}$, which makes it possible to prevent a glitch from occurring.

Next, the operation of the embodiment will be described.

(1) Operation performed when the least significant bit $A_0$ of the reference value A is at "0"

First, when the least significant bit $A_0$ of the reference value A is at "0", the selecting signal SEL is constantly held at "0". Therefore, the clock signal $\phi$ is identical to the master clock signal $\phi_0$. In this case, the operation of the PWM circuit is similar to that described with reference to FIG. 1. More specifically, the counter 5 counts pulses of the clock signal $\phi$ to deliver the count B. When the count B becomes equal to a numerical value of the more significant "n" bits of the reference value A, the logical state of the signal $S_4$ becomes equal to "1", and then the R-S flip-flop circuit 6 is set to "1" in synchronism with a fall of the signal $S_4$. Thereafter, upon a fall of the synchronizing pulse signal SYNC, the counter 5 and the R-S flip-flop circuit 6 are both reset.

(2) Operation performed when the least significant bit $A_0$ of the reference value A is at "1".

Next, when the least significant bit $A_0$ of the reference value A is at "1", as described hereinabove with reference to FIG. 5a to FIG. 5j, changeover of the clock signal $\phi$ between that based on the master clock signal $\phi_0$ and that based on the inverted clock signal $-\phi_0$ is effected whenever the synchronizing pulse signal SYNC falls to "0". Now, let a comparison be made between FIG. 5b and FIG. 5j by measuring time periods required before a predetermined number of clock pulses (of the master clock signal $\phi_0$ or the clock signal $\phi$) are generated within a time period from the time point $t_1$ to $t_{100}$. The comparison result shows that the time period required for the clock signal $\phi$ to rise the predetermined number of times is longer than that required by the master clock signal $\phi_0$ by a half repetition period within the time period from $t_0$ to $t_{100}$. The same applies to a corresponding time period after the time point $t_{100}$.

Thus, as compared with the case in which the least significant bit $A_0$ is at "0", incrementing of the count B is delayed by a half repetition period of the clock signal $\phi$, and hence the timing of rise of the signal $S_4$ is also delayed by a half repetition period of the clock signal $\phi$. In other words, according to the present embodiment, by setting the least significant bit of the reference value A to "0" or "1", it is possible to set the rise timing of the output signal $S_{OUT}$ in half repetition periods of the master clock signal $\phi_0$, which makes it possible to secure high time resolution (two times as high as conventional time resolution) even if the frequency of the master clock signal $\phi_0$ is low.

The present invention is by no means limited to the embodiment described above by way of example, but various modifications and variations can be made thereto without departing from the scope of the invention defined by the claims appended hereto. For example, the pulse counter circuit of the present invention may be applied not only to a PWM circuit as described above but also to various digital circuits in which pulses are counted to perform processings. Similarly, the pulse changeover circuit of the present invention may be applied to various devices in which changeover of pulse signals is required.

What is claimed is:

1. A pulse counter circuit comprising:

an invertor that inverts a pulse signal input to the pulse counter circuit to form an inverted signal;

a selecting signal-forming device that generates a selecting signal;

a selector device responsive to the selecting signal from the selecting signal-forming device, that selects one of the pulse signal and the inverted signal to deliver at least one cycle of the selected one of the pulse signal and the inverted signal as an output signal after receiving the selecting signal therein, and then selects another one of the pulse signal and the inverted signal to deliver at least one cycle of another one of the pulse signal and the inverted signal as an output signal, the selector device effecting changeover of a signal to be selected thereby between the pulse signal and the inverted signal at a timing of a change in level of the pulse signal; and a counter that counts pulses of the output signal from the selector device, wherein the pulse counter circuit is substantially capable of counting a clock having twice the frequency of the pulse signal.

2. A pulse counter circuit as claimed in claim 1, wherein the selector device selects one of the pulse signal and the inverted signal when the selecting signal is at a first predetermined level, and the other of the pulse signal and the inverted signal when the selecting signal is at a second predetermined level.

3. A pulse counter circuit as claimed in claim 1 or 2, wherein the selector device effects the changeover of a signal to be selected thereby between the pulse signal and the inverted signal, in synchronism with a rise or a fall of the pulse signal.

4. A pulse counter circuit as claimed in claim 1, wherein the selecting signal-forming device is responsive to a setting signal input thereto, that assumes a first mode in which the selecting signal is held at a first predetermined level, and a second mode in which the selecting signal is alternately changed to the first predetermined level and to a second predetermined level, the selector device selecting only a predetermined one of the pulse signal and the inverted signal, in the first mode, and alternately selecting the pulse signal and the inverted signal in response to changes in the selecting signal, in the second mode.

5. A pulse counter circuit as claimed in claim 4, wherein the selecting signal-forming device is responsive to a synchronizing signal input thereto, for changing the selecting signal, in the second mode.

6. A pulse counter circuit as claimed in claim 4 or 5, wherein the selector device includes a synthesizing device that synthesizes the pulse signal and the inverted signal alternately selected by the selector device to deliver the resulting synthesized signal as the output signal.

7. A pulse counter circuit as claimed in claim 1, wherein the selecting signal is synchronized with the pulse signal.

8. A pulse counter circuit comprising:

invertor means for inverting a pulse signal input to said pulse counter circuit to form an inverted signal;

selecting signal-forming means for generating a selecting signal;

selector means responsive to said selecting signal from said selecting signal-forming device, for forming one of said pulse signal and said inverted signal to deliver said selected one of the pulse signal and said inverted signal as an output signal, said selector means effecting changeover of a signal to be selected thereby between said pulse signal and said inverted signal, at timing of a change in level of said pulse signal; and counter means for counting pulses of said output signal from said selector means, wherein said selector means includes a first masking means responsive to a change in level of said selecting signal from a first predetermined level to a second predetermined level, for holding one of said pulse signal and said inverted signal at a predetermined level a predetermined time period earlier than said timing of said change in level of said pulse signal, and responsive to a subsequent change in level of said selecting signal from said second predetermined level to said first predetermined level, for causing said one of said pulse signal and said inverted signal to restore an original waveform thereof said predetermined time period later than said timing of said change in level of said pulse signal, second masking means responsive to a change in level of said selecting signal from said second predetermined level to said first predetermined level, for holding the other of said pulse signal and said inverted signal at said predetermined level said predetermined time period earlier than said timing of said change in level of said pulse signal, and responsive to a subsequent change in level of said selecting signal from said first predetermined level to said second predetermined level, for causing the other of said pulse signal and said inverted signal to restore an original waveform thereof said predetermined time period later than said timing of said change in level of said pulse signal, and synthesizing means for synthesizing said pulse signal and said inverted signal from said first and second masking means to deliver the resulting synthesized signal as said output signal.

9. A pulse counter circuit as claimed in claim 8, wherein said predetermined time period corresponds to a half repetition period of said pulse signal.

10. A pulse signal changeover circuit comprising:

input means for inputting a pulse signal and an inverted signal obtained by inverting said pulse signal;

selecting signal-forming means for forming a selecting signal;

selector means responsive to said selecting signal from said selecting means, for selecting one of said pulse signal and said inverted signal to deliver the selected one of said pulse signal and said inverted signal as an output signal;

first masking means for holding said pulse signal at a predetermined level within a predetermined time period;

second masking means for holding said inverted signal at said predetermined level within said predetermined time period; and changeover means for effecting changeover of a signal to be selected by said selecting means between said pulse signal and said inverted signal, within said predetermined time period.

11. A pulse signal changeover circuit as claimed in claim 10, wherein said changeover means is responsive to timing of a change in level of said selecting signal and timing of a change in level of said pulse signal, for effecting said changeover of a signal to be selected thereby between said pulse signal and said inverted signal, said predetermined time period being set based on said timing of said change in level of said selecting signal and said timing of said change in level of said pulse signal.

12. A pulse signal changeover circuit as claimed in claim 10 or 11, wherein said selector means includes synthesizing means for synthesizing said pulse signal and said inverted signal from said first and second masking means to deliver the resulting synthesized signal as said output signal.

13. A pulse counter circuit comprising:

an invertor that inverts a pulse signal input to the pulse counter circuit to form an inverted signal;

a selecting signal-forming device that generates a selecting signal;

a selector device responsive to the selecting signal from the selecting signal-forming device, that generates one of the pulse signal and the inverted signal to deliver the selected one of the pulse signal and the inverted signal as an output signal, the selector device effecting changeover of a signal to be selected thereby between the pulse signal and the inverted signal, at timing of a change in level of the pulse signal; and a counter that counts pulses of the output signal from the selector device, wherein the selector device includes a first masking device responsive to a change in level of the selecting signal from a first predetermined level to a second predetermined level, that holds one of the pulse signal and the inverted signal at a predetermined level a predetermined time period earlier than the timing of the change in level of the pulse signal, and responsive to a subsequent change in level of the selecting signal from the second predetermined level to the first predetermined level, that causes the one of the pulse signal and the inverted signal to restore an original waveform thereof the predetermined time period later than the timing of the change in level of the pulse signal, a second masking device responsive to a change in level of the selecting signal from the second predetermined level to the first predetermined level, that holds the other of the pulse signal and the inverted signal at the predetermined level the predetermined time period earlier than the timing of the change in level of the pulse signal, and responsive to a subsequent change in level of the selecting signal from the first predetermined level to the second predetermined level, that causes the other of the pulse signal and the inverted signal to restore an original waveform thereof the predetermined time period later than the timing of the change in level of the pulse signal, and a synthesizing device that synthesizes the pulse signal and the inverted signal from the first and second masking devices to deliver the resulting synthesized signal as the output signal.

14. A pulse counter circuit as claimed in claim 13, wherein the predetermined time period corresponds to a half repetition period of the pulse signal.

15. A pulse signal changeover circuit comprising:

an input device that inputs a pulse signal and an inverted signal obtained by inverting the pulse signal;

a selecting signal generator that forms a selecting signal;

a selector responsive to the selecting signal from the selecting signal generator, that selects one of the pulse signal and the inverted signal to deliver the selected one of the pulse signal and the inverted signal as an output signal;

a first masking device that holds the pulse signal at a predetermined level within a predetermined time period;

a second masking device that holds the inverted signal at the predetermined level within the predetermined time period; and a changeover device that effects changeover of a signal to be selected by the selector between the pulse signal and the inverted signal, within the predetermined time period.

16. A pulse signal changeover circuit as claimed in claim 15, wherein the changeover device is responsive to timing of a change in level of the selecting signal and timing of a change in level of the pulse signal, for effecting the changeover of a signal to be selected thereby between the pulse signal and the inverted signal, the predetermined time period being set based on the timing of the change in level of the selecting signal and the timing of the change in level of the pulse signal.

17. A pulse signal changeover circuit as claimed in claim 15, wherein the selector includes a synthesizing device that synthesizes the pulse signal and the inverted signal from the first and second masking devices to deliver the resulting synthesized signal as the output signal.

* * * * *